United States Patent
Kim

(10) Patent No.: US 7,154,319 B2
(45) Date of Patent: Dec. 26, 2006

(54) PULSE-BASED HIGH-SPEED LOW-POWER GATED FLIP-FLOP CIRCUIT

(75) Inventor: Min-Su Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 46 days.

(21) Appl. No.: 11/064,892

(22) Filed: Feb. 24, 2005

(65) Prior Publication Data

US 2006/0017483 A1    Jan. 26, 2006

(30) Foreign Application Priority Data

Jul. 21, 2004  (KR) ............... 10-2004-0056903

(51) Int. Cl.
  *H03K 3/12*  (2006.01)
  *H03K 3/289*  (2006.01)
(52) U.S. Cl. ............................ 327/218; 327/202
(58) Field of Classification Search ............ 327/202, 327/203, 208, 210–212, 218, 291
  See application file for complete search history.

(56) References Cited

U.S. PATENT DOCUMENTS

| | | | | |
|---|---|---|---|---|
| 5,557,225 A | * | 9/1996 | Denham et al. ............ | 327/199 |
| 5,760,610 A | * | 6/1998 | Naffziger .................. | 326/93 |
| 5,864,244 A | * | 1/1999 | Kaplinsky .................. | 326/58 |
| 6,501,315 B1 | * | 12/2002 | Nguyen .................... | 327/217 |
| 6,646,492 B1 | * | 11/2003 | Park et al. ............... | 327/530 |
| 2004/0222836 A1 | * | 11/2004 | Francom .................. | 327/298 |
| 2005/0253640 A1 | * | 11/2005 | Kim ........................ | 327/218 |

FOREIGN PATENT DOCUMENTS

| | | |
|---|---|---|
| JP | 08-274594 | 10/1996 |
| JP | 2000-165208 | 6/2000 |
| KR | 2001-0005004 | 1/2001 |

* cited by examiner

*Primary Examiner*—Quan Tra
*Assistant Examiner*—Rey Aranda
(74) *Attorney, Agent, or Firm*—Myers Bigel Sibley & Sajovec PA

(57) ABSTRACT

A high-speed gated flip-flop includes a latch configured to generate a data output signal (Q) in response to a data input signal (D) and a pair of true and complementary clock pulses (GCP,GCPB). These clock pulses are provided by a clock generator responsive to a periodic clock signal (CK). A control circuit is also provided. The control circuit is coupled to a feedback node (ND2) in the pulse generator. The control circuit configured to selectively enable the pulse generator in response to an enable signal (/EN). The pulse generator is configured so that an active transition of the true clock pulse (GCP) is fed back to the feedback node (ND2) in a manner that resets the pulse generator and terminates the true and complementary clock pulses in-sync with the active (e.g., low-to-high) transition of the true clock pulse (GCP).

21 Claims, 6 Drawing Sheets

PULSE-BASED HIGH-SPEED LOW-POWER GATED FLIP-FLOP CIRCUIT

CROSS-REFERENCE TO RELATED APPLICATIONS

This U.S. non-provisional patent application claims priority under 35 U.S.C. § 119 of Korean Patent Application 2004-56903 filed on Jul. 21, 2004, the entire contents of which are hereby incorporated by reference.

BACKGROUND OF THE INVENTION

The present invention relates to an integrated circuit and, more particularly, to a gated flip-flop circuit.

In general, digital logic systems are classified as a combinational circuit and a sequential circuit. The combination circuit comprises logic gates whose outputs are directly determined by current input values. The combination circuit performs a specific information processing operation logically specified by a series of Boolean expressions. The sequential circuit uses storage devices called as a flip-flop, in addition to the logic gates. Outputs of the storage devices are functions of inputs and states of storage devices. The states of the storage devices are functions of the previous inputs. Consequently, the outputs of the sequential circuit depend on previous values as well as current values, and the operation of the sequential circuit is characterized by a time sequence of the inputs and the inner states thereof.

All of the digital systems have combinational circuits, but almost all of the real systems comprise storage devices such as latches. The digital circuits using the latches are, for example, registers, counters, and static memory arrays, and so on. Therefore, to implement a high-speed low-power digital system, it is important, among other things, to effectively design flip-flops significantly related to a speed or a power of the digital system.

Typically, the speed of the flip-flop is determined by a DtoQ time. The DtoQ time can be represented as described below. As is well known, a setup time should be sufficiently assigned to latch data into the flip-flop in a stable manner. The setup time is indicated by tSETUP of FIG. 1. Data inputted in synchronization with a rise edge of a clock signal CLK is outputted as output data Dout after a predetermined time, which is indicated by tCtoQ of FIG. 1. Therefore, the DtoQ time (tDtoQ) to determine the speed of the flip-flop can be represented as a summation of the tSETUP and the tCtoQ.

For the recent digital system, it is quite important to improve the speed of the flip-flop as well as implement the low-power flip-flop. To meet these requirements, a gated flip-flop has been proposed. As is well known to those skilled in the art, the gated flip-flop is configured to operate only for an activation period of a control signal, which is called as an "enable signal". An exemplary gated flip-flop circuit is shown in FIG. 2. Referring to FIG. 2, a gated flip-flop circuit 1 latches data D in synchronization with a clock signal CK for the activation period of the enable signal EN, and outputs the latched data as output data Q. For the gated flip-flop circuit 1 shown in FIG. 2, the clock signal CK is not directly applied to a data transmission path (path comprising inverters 19, 20, 21, 22, 23 and 24) of the flip-flop circuit 1, but a gated clock signal GCK, or a combination of the clock signal CK and the enable signal EN, is applied to the data transmission path of the flip-flop circuit 1.

The speed of the gated flip-flop circuit 1 described above depends on the DtoQ time as well as the EtoQ time. This is because the clock signal is not directly applied to the data transmission path but the gate clock signal, or a combination of the clock signal and the enable signal, is applied to the data transmission path. Here, the EtoQ time refers to a delay time from the activation time of the enable signal EN to a data output time. As shown in FIG. 2, the transmission path of the gated flip-flop circuit (10, 11, 12, 13, 14, 15, 16, 17 and 18) determines the EtoQ time. Likewise, since the speed of the gated flip-flop circuit is determined by the DtoQ time as well as the EtoQ time, it is desirable to reduce the DtoQ time and the EtoQ time to implement a high-speed and low-power gated flip-flop circuit.

SUMMARY OF THE INVENTION

It is, therefore, an object of the present invention to provide a pulse-based high-speed low-power gated flip-flop circuit.

In an exemplary embodiment according to the present invention, there is provided a gated flip-flop circuit comprising: a pulse generator with a feedback node for generating gated clock pulse signals in synchronization with a clock signal, wherein any one of the gated clock pulse signals is fed back to the feedback node; a latch for receiving and latching data in response to the gated clock pulse signals; and a control circuit connected to the feedback node for controlling the feedback node in response to an enable signal such that the gated clock pulse signals are selectively generated in synchronization with the clock signal.

In the above embodiment, the pulse generator may include: a NAND gate having one input terminal for receiving the clock signal, the other input terminal connected to the feedback node, and an output terminal for outputting a first gated clock pulse signal among the gated clock pulse signals; an inverter for inverting an output of the NAND gate to output a second gated clock pulse signal; and an NMOS transistor controlled by the second gated clock pulse signal and connected between the feedback node and ground.

In the above embodiment, the control circuit may prevent the feedback node from being floated during a high-level period or a low-level period of the clock signal.

In the above embodiment, the control circuit may include: a first NMOS transistor connected between the feedback node and ground and controlled by the enable signal; and first and second PMOS transistors connected in series between a power supply voltage and the feedback node, wherein the first and second PMOS transistors are controlled by the enable signal and the clock signal, respectively.

In the above embodiment, the control circuit may further include: an inverter having an input terminal connected to the feedback node; and second and third NMOS transistors connected in series between the feedback node and ground, wherein the second NMOS transistor is controlled by the clock signal and the third NMOS transistor is controlled by an output of the inverter.

In the above embodiment, the second and third NMOS transistors and the inverter may constitute a latch for storing a logic state of the feedback node.

In another exemplary embodiment of the present invention, there is provided A gated flip-flop circuit comprising: a pulse generator with a feedback node for generating gated clock pulse signals in synchronization with a clock signal, wherein any one of the gated clock pulse signals is fed back to the feedback node; a latch for receiving and latching data in response to the gated clock pulse signals; and a control circuit connected to the feedback node for controlling the feedback node in response to an enable signal such that the gated clock pulse signals are selectively generated in synchronization with the clock signal, wherein the control circuit comprises: first and second PMOS transistors connected between a power supply voltage and the feedback node; and a first NMOS transistor connected between the feedback node and ground, wherein the first PMOS transistor and the first NMOS transistor are controlled by the enable signal and the second NMOS transistor is controlled by the clock signal.

In the above embodiment, the control circuit may prevent the feedback node from being floated during a high-level period or a low-level period of the clock signal.

In the above embodiment, the control circuit may further include: a first inverter having an input terminal connected to the feedback node; and second and third NMOS transistors connected in series between the feedback node and ground, wherein the second NMOS transistor is controlled by the clock signal and the third NMOS transistor is controlled by an output of the first inverter.

In the above embodiment, the second and third NMOS transistors and the first inverter may constitute a latch for storing a logic state of the feedback node.

In the above embodiment, the pulse generator may include: a NAND gate having one input terminal for receiving the clock signal, the other input terminal connected to the feedback node, and an output terminal for outputting a first gated clock pulse signal among the gated clock pulse signals; a second inverter for inverting an output of the NAND gate to output a second gated clock pulse signal; and an NMOS transistor controlled by the second gated clock pulse signal and connected between the feedback node and ground.

In the above embodiment, an output of the latch may be set to be a predetermined logic state by a preset signal.

In the above embodiment, the control circuit may control the feedback node such that the logic states of the gated clock pulse signals remain constant during activation of the preset signal irrespective of the enable signal.

In the above embodiment, the control circuit may further include: a third PMOS transistor connected between the power supply voltage and the first PMOS transistor and controlled by the preset signal; and a second NMOS transistor connected between the feedback node and ground and controlled by the preset signal.

In the above embodiment, the output of the latch may be set to be a predetermined logic state by a reset signal, and the control circuit may control the feedback node such that the logic states of the gated clock pulse signals remain constant during activation of the reset signal irrespective of the enable signal. In addition, the control circuit may further include: a third PMOS transistor connected between the power supply voltage and the first PMOS transistor and controlled by the reset signal; and a second NMOS transistor connected between the feedback node and ground and controlled by the reset signal.

In the above embodiment, the latch may receive normal data or scan data depending on activation of a scan enable signal, and the control circuit may further include: a third PMOS transistor connected between the power supply voltage and the second PMOS transistor and controlled by the scan enable signal; and a second NMOS transistor connected between the first NMOS transistor and ground and controlled by the scan enable signal.

In yet another exemplary embodiment of the present invention, there is provided a gated flip-flop circuit comprising: a pulse generator with a feedback node for generating gated clock pulse signals in synchronization with a clock signal; a latch for receiving and latching data in response to the gated clock pulse signals; and a control circuit connected to the feedback node for controlling the feedback node in response to an enable signal and the clock signal, wherein the control circuit comprises: first and second PMOS transistors connected in series between a power supply voltage and the feedback node, wherein the first and second PMOS transistors are controlled by the enable signal and the clock signal, respectively; a first NMOS transistor connected between the feedback node and ground and controlled by the enable signal; a first inverter having an input terminal connected to the feedback node; and second and third NMOS transistors connected in series between the feedback node and ground, wherein the second NMOS transistor is controlled by the clock signal, and the third NMOS transistor is controlled by an output of the inverter.

In yet another exemplary embodiment of the present invention, there is provided a gated flip-flop circuit comprising: a pulse generator with a feedback node for generating gated clock pulse signals in synchronization with a clock signal; a latch for receiving and latching data in response to the gated clock pulse signals; and a control circuit connected to the feedback node for controlling the feedback node in response to a preset signal, an enable signal, and the clock signal, wherein the control circuit comprises: first to third PMOS transistors connected in series between a power supply voltage and the feedback node, wherein the first to third PMOS transistors are controlled by the preset signal, the enable signal, and the clock signal, respectively; a first NMOS transistor connected between the feedback node and ground and controlled by the preset signal; a second NMOS transistor connected between the feedback node and ground and controlled by the enable signal; an inverter having an input terminal connected to the feedback node; and third and fourth NMOS transistors connected in series between the feedback node and ground, wherein the third NMOS transistor is controlled by the clock signal and the fourth NMOS transistor is controlled by an output of the inverter.

In yet another exemplary embodiment of the present invention, there is provided a gated flip-flop circuit comprising: a pulse generator with a feedback node for generating gated clock pulse signals in synchronization with a clock signal; a latch for receiving and latching data in response to the gated clock pulse signals; and a control circuit connected to the feedback node for controlling the feedback node in response to a reset signal, an enable signal, and the clock signal, wherein the control circuit comprises: first to third PMOS transistors connected in series between a power supply voltage and the feedback node, wherein the first to third PMOS transistors are controlled by the reset signal, the enable signal, and the clock signal, respectively; a first NMOS transistor connected between the feedback node and ground and controlled by the reset signal; a second NMOS transistor connected between the feedback node and ground and controlled by the enable signal; an inverter having an input terminal connected to the feedback node; and third and fourth NMOS transistors connected in series between the feedback node and ground, wherein the third NMOS transistor is controlled by the clock signal and the fourth NMOS transistor is controlled by an output of the inverter.

In yet another exemplary embodiment of the present invention, there is provided a gated flip-flop circuit comprising: a pulse generator with a feedback node for generating gated clock pulse signals in synchronization with a clock signal; a latch for receiving and latching data in response to the gated clock pulse signals; and a control circuit connected to the feedback node for controlling the feedback node in response to a scan enable signal, an enable signal, and the clock signal, wherein the control circuit comprises: first and second PMOS transistors connected in series between a power supply voltage and the feedback node, wherein the first and second PMOS transistors are controlled by the enable signal and the clock signal, respectively; first and second NMOS transistors connected between the feedback node and ground, wherein the first and second NMOS transistors are controlled by the enable signal and the scan enable signal, respectively; an inverter having an input terminal connected to the feedback node; and third and fourth NMOS transistors connected in series between the feedback node and ground, wherein the third NMOS transistor is controlled by the clock signal and the fourth NMOS transistor is controlled by an output of the inverter.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

Figure 3:
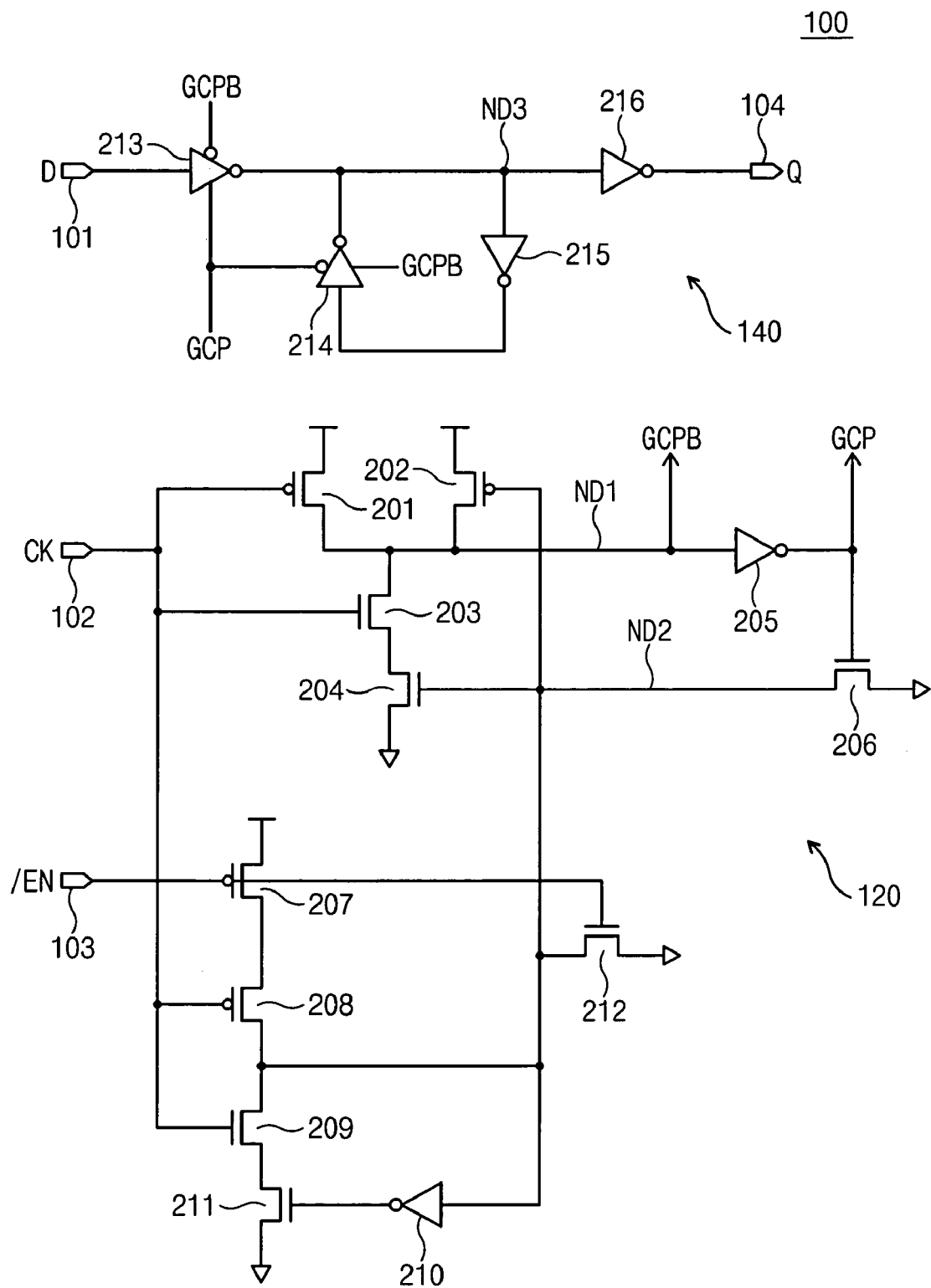
FIG. 3 is a circuit diagram showing a pulse-based gated flip-flop circuit according to the first embodiment of the present invention.

FIG. 3 is a circuit diagram showing a pulse-based gated flip-flop circuit according to the first embodiment of the present invention.

Referring to FIG. 3, the gated flip-flop circuit 100 according to the first embodiment of the present invention comprises a data input terminal 101, a clock terminal 102, a control terminal 103, and a data output terminal 104. Data is applied to the data input terminal 101, a clock signal CK is applied to the clock terminal 102, and an enable signal /EN is applied to the control terminal 103. Output data Q of the gated flip-flop circuit is output through the data output terminal 104. The gated flip-flop circuit 100 according to the first embodiment of the present invention comprises a gated clock pulse generation unit 120 and a latch unit 140.

The gated clock pulse generation unit 120 generates gated clock pulse signals GCP and GCPB in response to a transition of the clock signal (e.g., low-high transition) during activation of the enable signal /EN. For example, the gated clock pulse generation unit 120 generates the gated clock pulse signals GCP and GCPB in synchronization with the transition of the clock signal CK (e.g., low-high transition) during activation of the enable signal /EN. The gated clock pulse signals GCP and GCPB maintain given logic states (e.g., low-level and high-level) irrespective of the transition of the clock signal CK during inactivation of the enable signal /EN. This will be described below in more detail. The gated clock pulse generation unit 120 comprises PMOS transistors 201, 202, 207, and 208, inverters 205 and 210, and NMOS transistors 203, 204, 206, 209, 211 and 212.

The PMOS transistor 201 has a source connected to a power supply voltage, a drain connected to an ND1 node, and a gate connected to the clock terminal 102 (or connected to receive the clock signal CK). The NMOS transistor 203 has a drain connected to the ND1 node and a gate connected to receive the clock signal CK. The NMOS transistor 204 has a gate connected to an ND2 node (referred also as a feedback node), a drain connected to a source of the NMOS transistor 203, and a source connected to ground. The PMOS transistor 202 has a gate connected to the ND2 node, a source connected to the power supply voltage, and a drain connected to the ND1 node. The gated clock pulse signal GCPB is output from the ND1 node, and the inverter 205 inverts the gated clock pulse signal GCPB to output the gated clock pulse signal GCP. The NMOS transistor 206 has a gate connected to receive the output signal GCP of the inverter 205, a drain connected to the ND2 node, and a source connected to ground.

The PMOS transistors 201 and 202 and the NMOS transistors 203 and 204 constitute a 2-input NAND gate that receives a signal of the ND2 node and the clock signal CK.

The PMOS transistor 207 has a source connected to the power supply voltage and a gate connected to the control terminal 103 (or connected to receive the enable signal /EN). The PMOS transistor 208 has a gate connected to receive the clock signal CK, a source connected to a drain of the PMOS transistor 207, and a drain connected to the ND2 node. The NMOS transistor 209 has a drain connected to the ND2 node and a gate connected to the clock terminal 102 (or connected to receive the clock signal CK). The NMOS transistor 211 has a drain connected to a source of the NMOS transistor 209, a source connected to ground, and a gate connected to an output terminal of the inverter 210. The inverter 210 has an input terminal connected to the ND2 node. The NMOS transistor 212 has a gate connected to receive the enable signal /EN, a drain connected to the ND2 node, and a source connected to ground.

Referring still to FIG. 3, the latch unit 140 comprises two 3-phase inverters 213 and 214, and two inverters 215 and 216. The 3-phase inverter 213 has an input terminal connected to receive data D and an output terminal connected to an ND3 node. The inverter 216 has an input terminal connected to the ND3 node and an output terminal for outputting the output data Q (or connected to the output terminal 104). The 3-phase inverter 214 has an output terminal connected to the ND3 node. The inverter 215 has an input terminal connected to the ND3 node and an output terminal connected to the input terminal of the 3-phase inverter 214. The 3-phase inverters 213 and 214 are controlled by the gated clock pulse signals GCP and GCPB output from the gated clock pulse generation unit 120, and the inverters 214 and 215 constitute the latch that operates in response to the gated clock pulse signals GCP and GCPB.

An operation of the gated flip-flop circuit according to the first embodiment of the present invention will now be described in detail.

Assume that the enable signal /EN is inactivated (the enable signal /EN is in the high level). Since the enable signal /EN is in the high-level, the PMOS transistor 207 turns off, while the NMOS transistor 212 turns on. This causes the ND2 node to be grounded. As the ND2 node is connected to ground, the NMOS transistor 204 turns off and the PMOS transistor 202 turns on. This indicates that the gated clock pulse signal GCPB remains high and the gated clock pulse signal GCP remains low. When the enable signal /EN is in the high-level or inactivated, the logic states of the gated clock pulse signals GCP and GCPB are not changed by a transition of the clock signal CK. As the gated clock pulse signal GCPB remains high and the gated clock signal GCP remains low, the 3-phase inverter 213 is inactivated. Therefore, the data signal of the data input terminal 101 is not transferred to the ND3 node. Here, the 3-phase inverter 214 is activated to latch the logic state of the ND3 node with the inverters 214 and 215, and latch the logic states of the ND2 node with the inverter 210 and the NMOS transistors 209 and 211.

When the enable signal /EN is activated to be low, the PMOS transistor 207 turns on, while the NMOS transistor 212 turns off. When the clock signal CK is in the low-level, the previous logic states of the gated clock pulse signals GCP and GCPB are maintained. When the clock signal transits from the low-level to the high-level, the NMOS transistor 203 turns on and the node of the ND1 node is connected to ground via the NMOS transistors 203 and 204. This causes the gated clock pulse signal GCPB to transit from the high-level to the low-level and the gated clock pulse signal GCP to transit from the low-level to the high-level. The high-level gated clock pulse signal GCP and the low-level gated clock pulse signal GCPB activate the 3-phase inverters 213 to transfer the data signal of the input terminal 101 to the ND3 node. Here, the high-level gated clock pulse signal GCP and the low-level gated clock pulse signal GCPB inactivate the 3-phase inverter GCPB.

As the pulse signal GCP transits from the low-level to the high-level to be activated, the NMOS transistor 206 turns on. Consequently, as the ND2 node is connected to ground using the turned on transistor 206, the NMOS transistor 204 turns off and the PMOS transistor 202 turns on. This causes the gated clock pulse signal GCPB to transit from the low-level to the high-level and the gated clock pulse signal GCP to transit from the high-level to the low level. In other words, the gated clock pulse signals GCP and GCPB are generated when the clock signal CK transits from the low-level to the high-level. Even when the clock signal CK transits from the high-level to the low-level, the logic states of the gated clock pulse signals GCP and GCPB are not changed since the ND3 node is in the low-level.

As described above, the elements 201 to 206 of FIG. 3 constitute feedback type pulse generation means for generating the gated clock pulse signals GCP and GCPB, and the elements 207 to 212 constitute a control circuit for controlling the feedback node ND2 of the pulse generation means. In particular, the elements 209, 210 and 211 constitute means for preventing the ND2 node (or feedback node ND2) from being floated during the high-level period of the clock signal CK, and the elements 207, 208 and 212 constitute means for preventing the generation of the gated clock pulse signals GCP and GCPB irrespective of the transition of the clock signal CK.

As is well known, when the enable signal /EN is activated, the gated flip-flop circuit latches the data in synchronization with the clock signal CK, while when the enable signal /EN is inactivated, the gated flip-flop circuit is not operated (or does not latch the data). This indicates that the gated flip-flop circuit is suitable for a low-power digital circuit design. As described above, the flip-flop circuit according to the first embodiment of the present invention is selectively operated depending on the logic state of the enable signal /EN, and thus, it acts as a gated flip-flop circuit. In addition, the gated flip-flop circuit 100 according to the first embodiment of the present invention operates as a basis of the gated clock pulse signals GCP and GCPB. For this reason, the gated flip-flop circuit 100 according to the first embodiment of the present invention falls into a pulse-based high-speed low-power gated flip-flop circuit.

Figure 1:
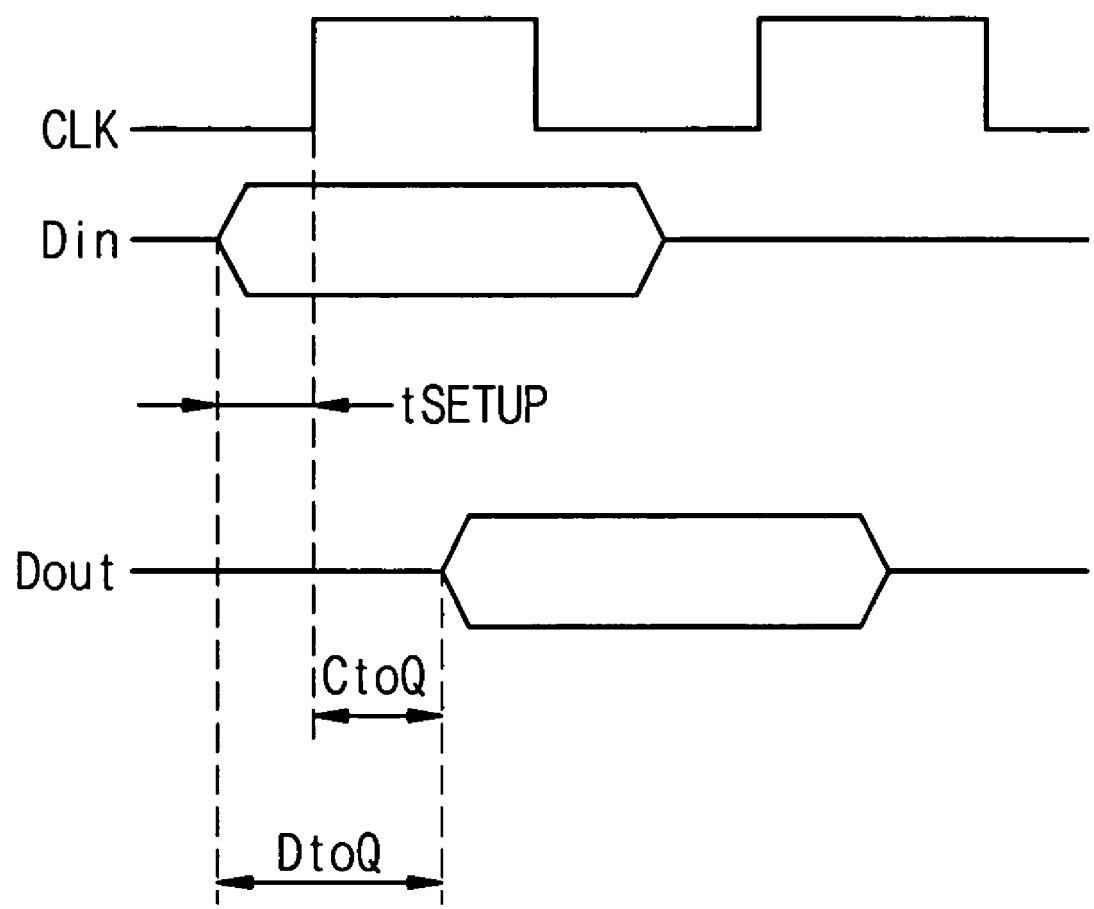
FIG. 1 is a diagram for illustrating a DtoQ time and an EtoQ time of a flip-flop circuit.
Figure 2:
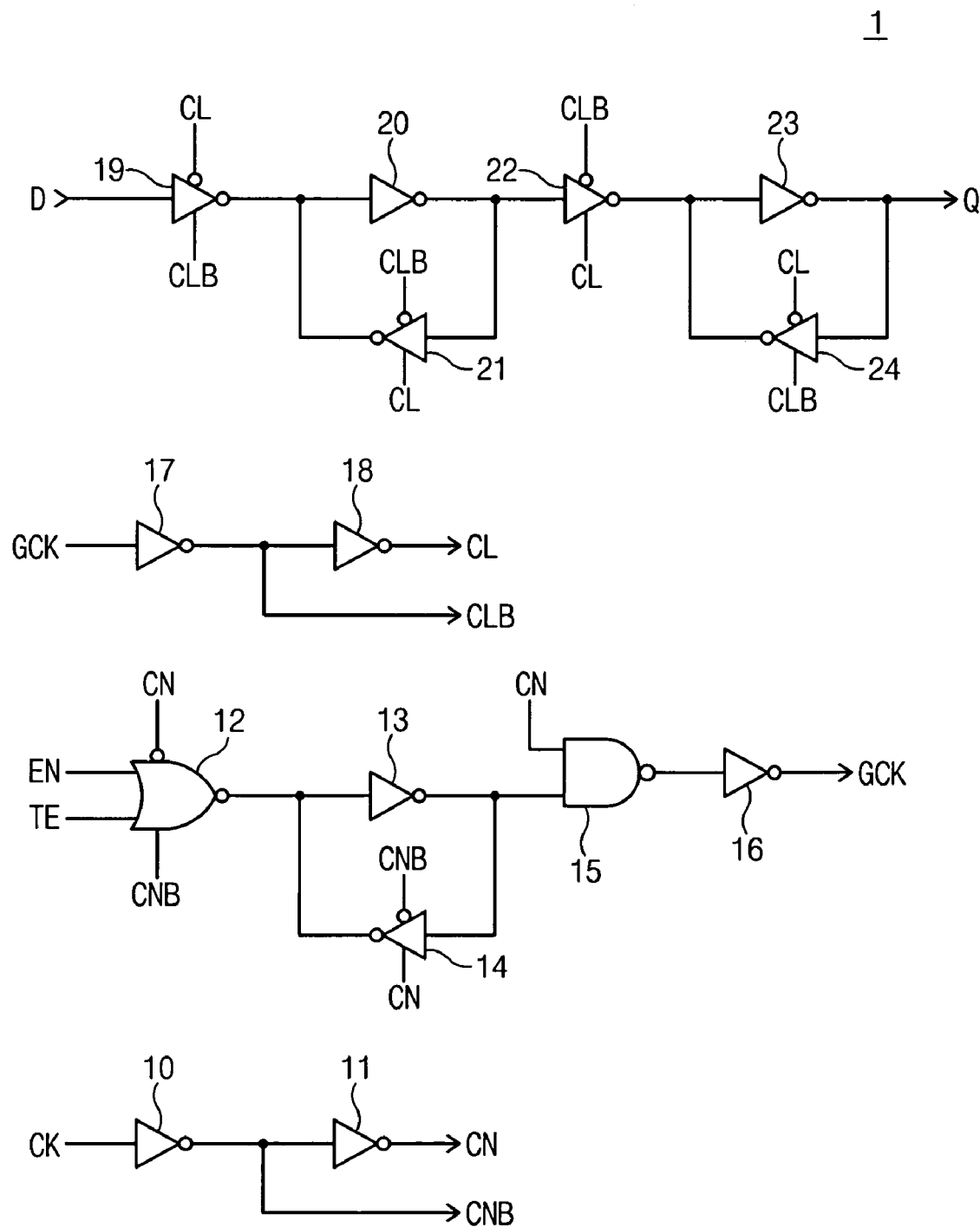
FIG. 2 is a circuit diagram showing a typical gated flip-flop circuit.

For the gated flip-flop circuit 100 according to the first embodiment of the present invention, the EtoQ time and the DtoQ time are reduced compared with those shown in FIG. 1. The EtoQ time, which refers to a delay time from the activation time of the enable signal /EN to the data output time, of the flip-flop circuit shown in FIG. 1 is determined by the transmission path 12, 13, 15, 16, 17, 18, 22, and 23, while the EtoQ time of the flip-flop circuit shown in FIG. 3 is determined by the transmission path (inverter 205, 214 and 216, comprising transistors 207, 208, 209, and 211). Therefore, the EtoQ time of the gated flip-flop circuit according to the present invention is shorter than that shown in FIG. 1. In addition, since the DtoQ time of the gated flip-flop circuit according to the present invention is determined by two inverters 213 and 216, the DtoQ time can be reduced compared with that shown in FIG. 1. Therefore, the gated flip-flop circuit according to the present invention falls into a high-speed low-power gated flip-flop circuit, which is suitable for a high-speed low-power digital system design.

Figure 4:
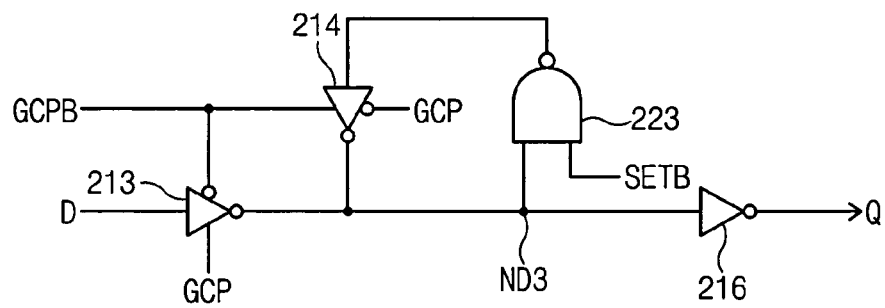
FIG. 4 is a circuit diagram showing a pulse-based gated flip-flop circuit according to the second embodiment of the present invention.
Figure 4:
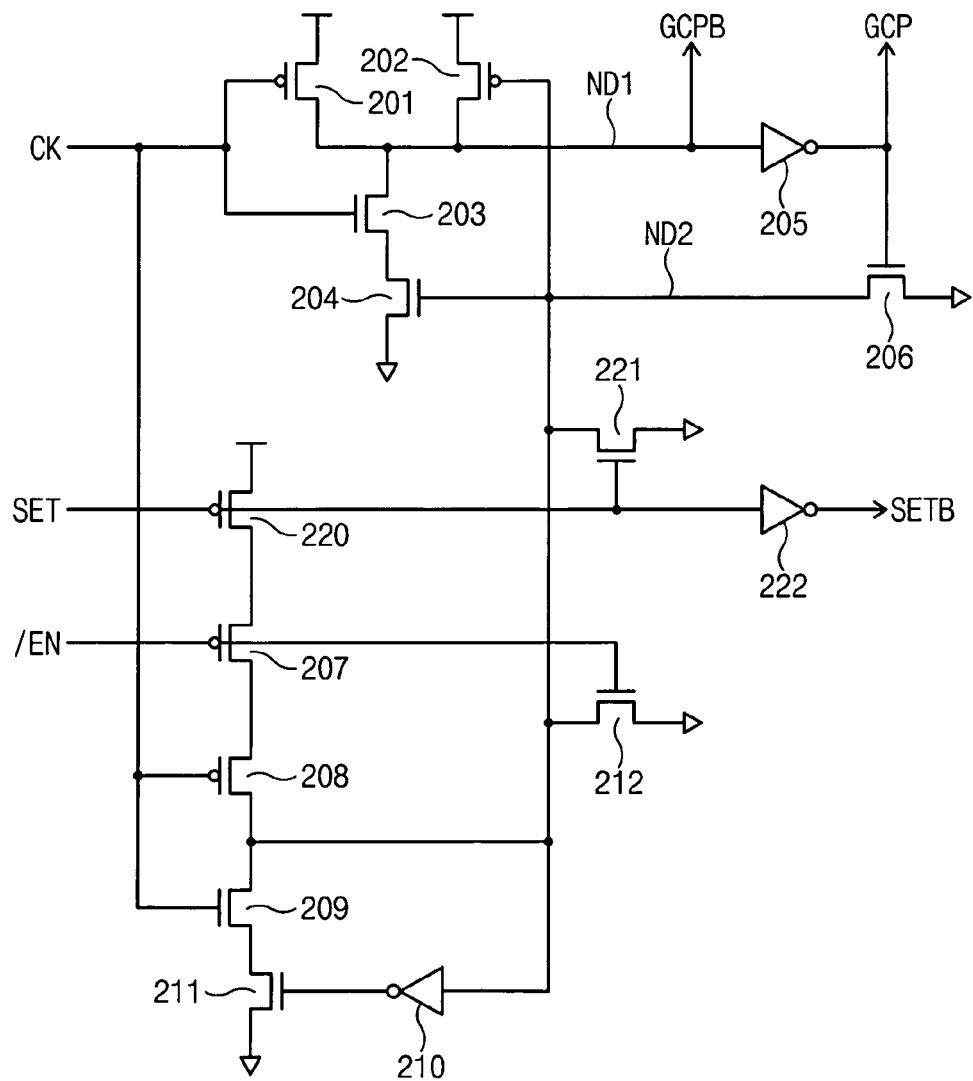

FIG. 4 is a circuit diagram showing a pulse-based gated flip-flop circuit according to the second embodiment of the present invention.

Referring to FIG. 4, the pulse-based gated flip-flop circuit 200 according to the second embodiment of the present invention is substantially the same as that shown in FIG. 3 except that a preset function is added. In FIG. 4, like numbers refer to like elements as shown in FIG. 3. To implement the preset function, a PMOS transistor 220, an NMOS transistor 221, and an inverter 222 are added to the flip-flop circuit of FIG. 3, and an NAND gate 223 is used instead of the inverter 215 of FIG. 3. Except for these, the gated flip-flop circuit 200 shown in FIG. 4 is substantially the same as that shown in FIG. 3, so that the description thereof will be omitted. The output signal Q of the pulse-based gated flip-flop circuit 200 shown in FIG. 4 is set to be high-level when a preset signal SET is in the high-level.

Here, irrespective of the transition of the clock signal CK, the gated clock pulse signals GCP and GCPB remains the high-level and the low-level, respectively. In other words, the logic states of the gated clock pulse signals GCP and GCPB are not changed irrespective of the transition of the clock signal CK. When the preset signal SET is set to be low-level, the flip-flop circuit 200 acts as a gated flip-flop circuit described in FIG. 3, in response to the enable signal /EN and the clock signal CK.

Figure 5:
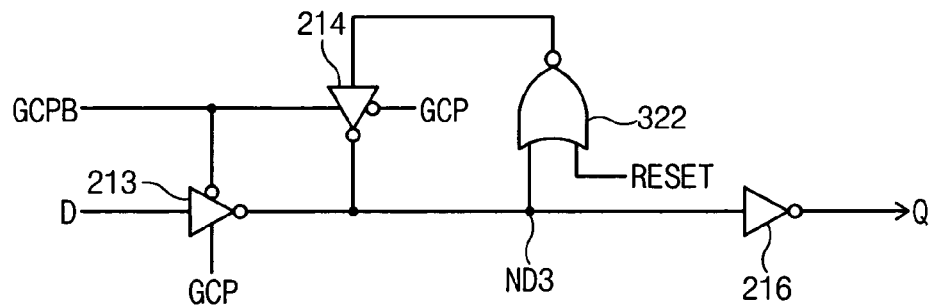
FIG. 5 is a circuit diagram showing a pulse-based gated flip-flop circuit according to the third embodiment of the present invention.
Figure 5:
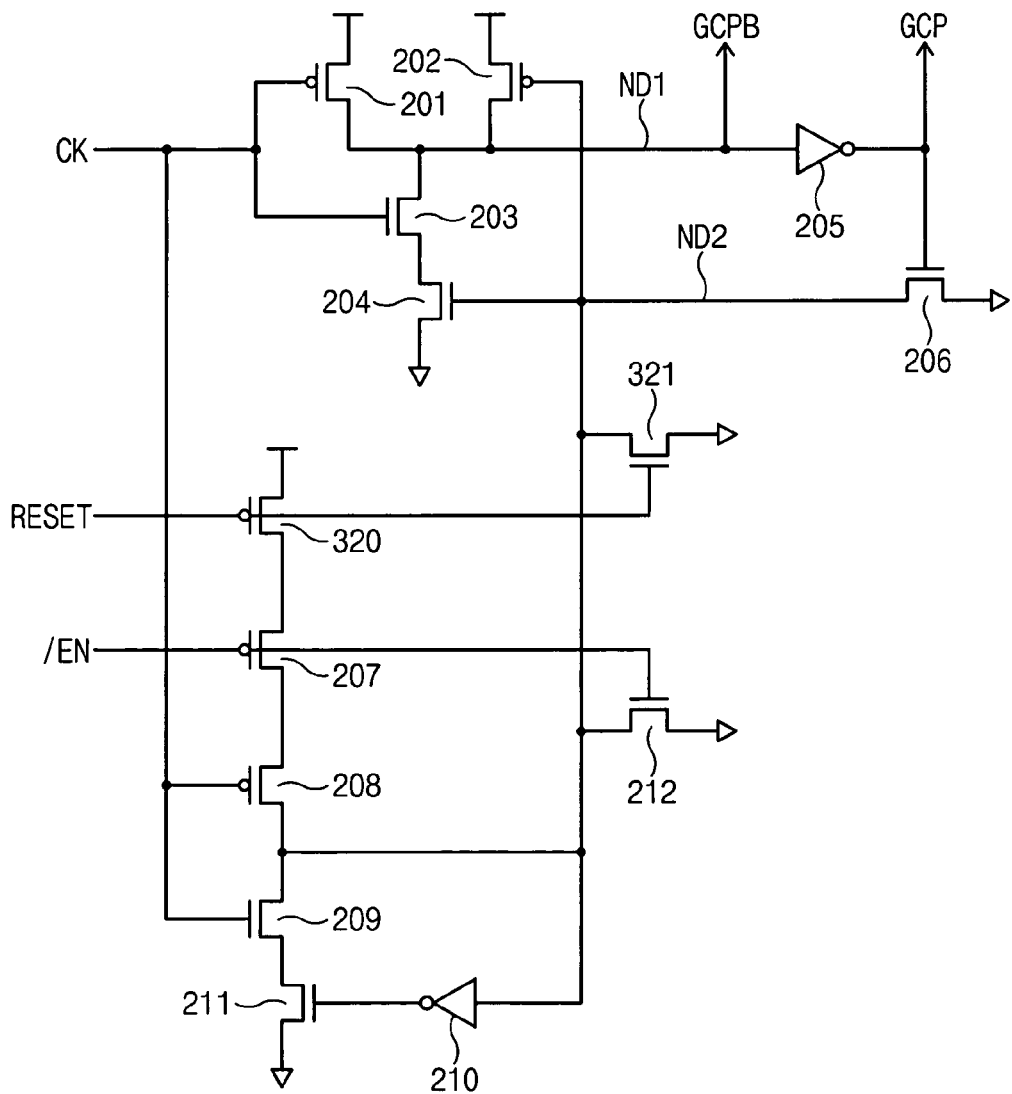

FIG. 5 is a circuit diagram showing a pulse-based gated flip-flop circuit according to the third embodiment of the present invention.

Referring to FIG. 5, the pulse-based gated flip-flop circuit 300 according to the third embodiment of the present invention is substantially the same as that shown in FIG. 3 except that a reset function is added. In FIG. 5, like numbers refer to like elements as shown in FIG. 3. To implement the reset function, a PMOS transistor 320 and an NMOS transistor 321 are added to the flip-flop circuit of FIG. 3, and a NOR gate 322 is used instead of the inverter 215 of FIG. 3. Except for these, the gated flip-flop circuit 300 shown in FIG. 5 is substantially the same as that shown in FIG. 3, so that the description thereof will be omitted. The output signal Q of the pulse-based gated flip-flop circuit 300 shown in FIG. 5 is set to be high-level when the reset signal RESET is in the low-level. Here, irrespective of the transition of the clock signal CK, the gated clock pulse signals GCP and GCPB remains the high-level and the low-level, respectively. In other words, the logic states of the gated clock pulse signals GCP and GCPB are not changed irrespective of the transition of the clock signal CK. When the reset signal RESET is set to be low-level, the flip-flop circuit 300 acts as a gated flip-flop circuit described in FIG. 3, in response to the enable signal /EN and the clock signal CK.

Figure 6:
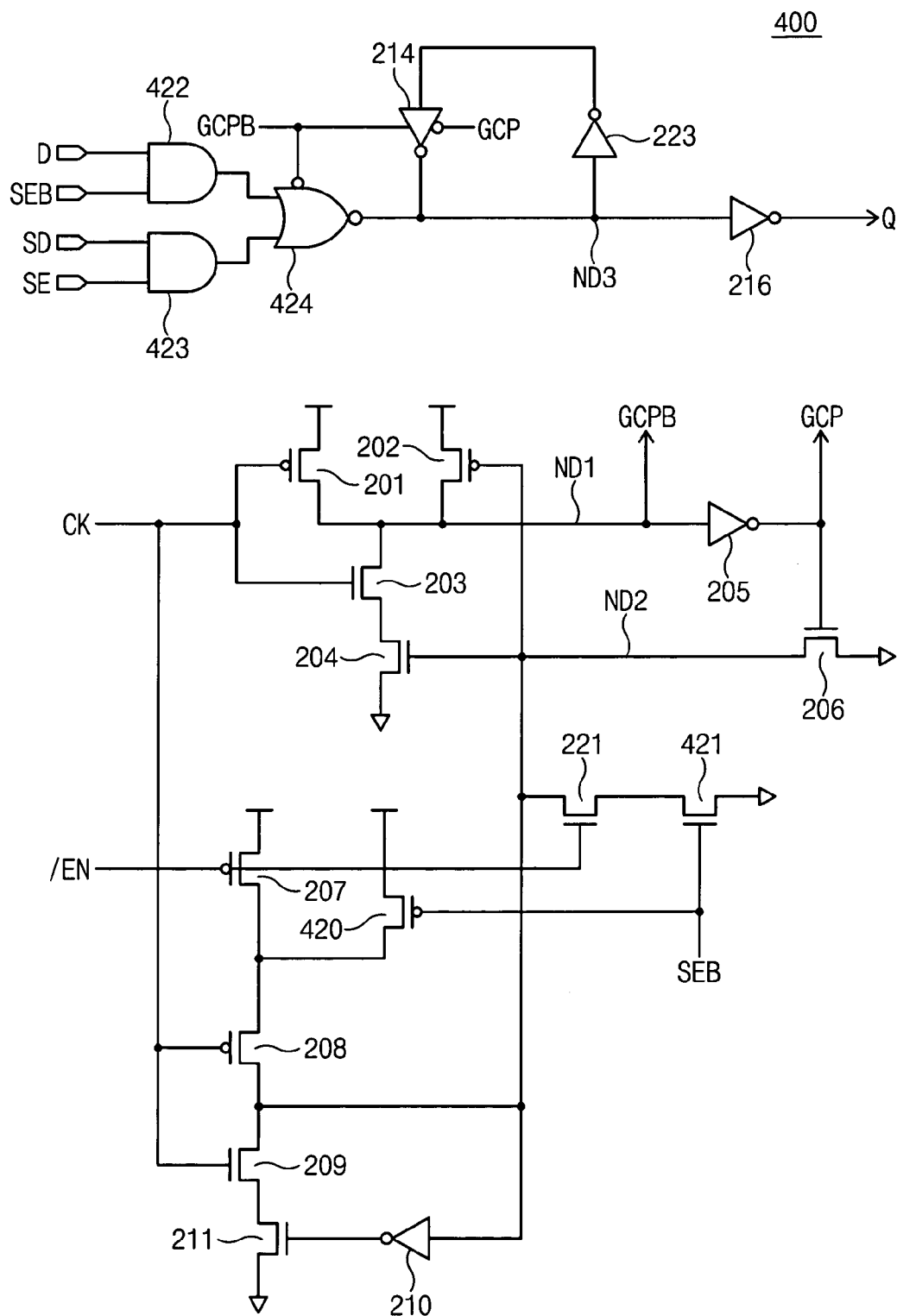
FIG. 6 is a circuit diagram showing a pulse-based gated flip-flop circuit according to the fourth embodiment of the present invention.

FIG. 6 is a circuit diagram showing a pulse-based gated flip-flop circuit according to the fourth embodiment of the present invention.

Referring to FIG. 6, the pulse-based gated flip-flop circuit 400 according to the fourth embodiment of the present invention is substantially the same as that shown in FIG. 3 except that a scan function is added. In FIG. 6, like numbers refer to like elements as shown in FIG. 3. To implement the scan function, a PMOS transistor 420, an NMOS transistor 421, and AND gates 422 and 423 are added to the flip-flop circuit of FIG. 3, and a NOR gate 424 controlled by the gated clock pulse signals GCP and GCPB is used instead of the 3-phase inverter 213 of FIG. 3. Except for these, the gated flip-flop circuit 400 shown in FIG. 6 is substantially the same as that shown in FIG. 3, so that the description thereof will be omitted. The output signal Q of the pulse-based gated flip-flop circuit 400 shown in FIG. 6 makes a scan operation irrespective of the enable signal /EN, and makes a non-scan operation in synchronization with the enable signal /EN and the clock signal CK. For example, as the scan enable signal /SE is set to be low-level during the scan operation, the gated clock signal pulses GCP and GCPB are generated irrespective of the enable signal /EN. As the scan enable signal /SE is set to be high-level during the non-scan operation, the gated clock signal pulses GCP and GCPB are selectively generated depending on the logic state of the enable signal /EN. In other words, the flip-flip circuit shown in FIG. 6 acts as a gated flip-flop circuit described in FIG. 3, in response to the enable signal /EN and the clock signal/CK.

It will be apparent to those skilled in the art that various embodiments described above can be combined. For example, the gated flip-flop circuit according to the present invention can be embodied as having a scan function and a reset function. In addition, the gated flip-flop circuit according to the present invention can be embodied as having a scan function, a preset function, and a reset function.

As described above, a pulse-based high-speed low-power gated flip-flop circuit can be implemented.

Although arrangements and operations of the circuit according to the present invention have been illustrated and described with reference to the description and the attached drawings, these are just illustrative only, and a variety of modifications and changes can be made without departing from the spirit and scope of the present invention.

What is claimed is:

1. A gated flip-flop, comprising:
   a latch configured to generate a data output signal in response to a data input signal and a pair of true and complementary clock pulses;
   a pulse generator configured to generate the true and complementary clock pulses in response to a periodic clock signal; and
   a control circuit coupled to a feedback node in said pulse generator, said control circuit configured to selectively enable said pulse generator in response to an enable signal;
   wherein said pulse generator is configured so that the true clock pulse is fed back to the feedback node in a manner that resets said pulse generator and terminates the true and complementary clock pulses in-sync with a leading edge of the true clock pulse.

2. A gated flip-flop, comprising:
   a latch configured to generate a data output signal in response to a data input signal and a pair of true and complementary clock pulses;
   a pulse generator configured to generate the true and complementary clock pulses in response to a periodic clock signal; and
   a control circuit coupled to a feedback node in said pulse generator, said control circuit configured to selectively enable said pulse generator in response to an enable signal;
   wherein said latch and said control circuit are responsive to a signal selected from a group consisting of a set signal and a reset signal.

3. The flip-flop of claim 1, wherein said latch comprises a combinational input circuit responsive to the data input signal, a scan data input signal and true and complementary scan enable signals.

4. A gated flip-flop circuit comprising:
   a pulse generator with a feedback node for generating gated clock pulse signals in synchronization with a clock signal, wherein any one of the gated clock pulse signals is fed back to the feedback node;
   a latch for receiving and latching data in response to the gated clock pulse signals; and
   a control circuit connected to the feedback node for controlling the feedback node in response to an enable signal such that the gated clock pulse signals are selectively generated in synchronization with the clock signal;
   wherein the pulse generator comprises:
      a NAND gate having one input terminal for receiving the clock signal, the other input terminal connected to the feedback node, and an output terminal for outputting a first gated clock pulse signal among the gated clock pulse signals;
      an inverter for inverting an output of the NAND gate to output a second gated clock pulse signal; and an NMOS transistor controlled by the second gated clock pulse signal and connected between the feedback node and ground.

5. The gated flip-flop circuit according to claim 4, wherein the control circuit prevents the feedback node from being floated during a high-level period or a low-level period of the clock signal.

6. The gated flip-flop circuit according to claim 4, wherein the control circuit comprises:
a first NMOS transistor connected between the feedback node and ground and controlled by the enable signal; and
first and second PMOS transistors connected in series between a power supply voltage and the feedback node, wherein the first and second PMOS transistors are controlled by the enable signal and the clock signal, respectively.

7. The gated flip-flop circuit according to claim 6, wherein the control circuit further comprises:
an inverter having an input terminal connected to the feedback node; and
second and third NMOS transistors connected in series between the feedback node and ground, wherein the second NMOS transistor is controlled by the clock signal and the third NMOS transistor is controlled by an output of the inverter.

8. The gated flip-flop circuit according to claim 7, wherein the second and third NMOS transistors and the inverter constitute a latch for storing a logic state of the feedback node.

9. A gated flip-flop circuit comprising:
a pulse generator with a feedback node for generating gated clock pulse signals in synchronization with a clock signal, wherein any one of the gated clock pulse signals is fed back to the feedback node;
a latch for receiving and latching data in response to the gated clock pulse signals, said latch having an output that is set to a first logic state by a first signal selected from a group consisting of a preset signal and a reset signal; and
a control circuit connected to the feedback node for controlling the feedback node in response to an enable signal and the first signal such that the gated clock pulse signals are selectively generated in synchronization with the clock signal,
wherein the control circuit comprises:
first and second PMOS transistors connected between a power supply voltage and the feedback node; and
a first NMOS transistor connected between the feedback node and ground,
wherein the first PMOS transistor and the first NMOS transistor are controlled by the enable signal and the second NMOS transistor is controlled by the clock signal.

10. The gated flip-flop circuit according to claim 9, wherein the control circuit prevents the feedback node from being floated during a high-level period or a low-level period of the clock signal.

11. The gated flip-flop circuit according to claim 10, wherein the control circuit further comprises:
a first inverter having an input terminal connected to the feedback node; and
second and third NMOS transistors connected in series between the feedback node and ground,
wherein the second NMOS transistor is controlled by the clock signal and the third NMOS transistor is controlled by an output of the first inverter.

12. The gated flip-flop circuit according to claim 11, wherein the second and third NMOS transistors and the first inverter constitute a latch for storing a logic state of the feedback node.

13. The gated flip-flop circuit according to claim 12, wherein the pulse generator comprises:
a NAND gate having one input terminal for receiving the clock signal, the other input terminal connected to the feedback node, and an output terminal for outputting a first gated clock pulse signal among the gated clock pulse signals;
a second inverter for inverting an output of the NAND gate to output a second gated clock pulse signal; and
an NMOS transistor controlled by the second gated clock pulse signal and connected between the feedback node and ground.

14. The gated flip-flop circuit according to claim 9, wherein the control circuit controls the feedback node such that the logic states of the gated clock pulse signals remain constant during activation of the first signal irrespective of the enable signal.

15. The gated flip-flop circuit according to claim 9, wherein the control circuit further comprises:
a third PMOS transistor connected between the power supply voltage and the first PMOS transistor and controlled by the first signal; and
a second NMOS transistor connected between the feedback node and ground and controlled by the first signal.

16. The gated flip-flop circuit according to claim 9, wherein the latch receives normal data or scan data depending on activation of a scan enable signal.

17. The gated flip-flop circuit according to claim 16, wherein the control circuit further comprises:
a third PMOS transistor connected between the power supply voltage and the second PMOS transistor and controlled by the scan enable signal; and
a second NMOS transistor connected between the first NMOS transistor and ground and controlled by the scan enable signal.

18. A gated flip-flop circuit comprising:
a pulse generator with a feedback node for generating gated clock pulse signals in synchronization with a clock signal;
a latch for receiving and latching data in response to the gated clock pulse signals; and
a control circuit connected to the feedback node for controlling the feedback node in response to a preset signal, an enable signal, and the clock signal,
wherein the control circuit comprises:
first to third PMOS transistors connected in series between a power supply voltage and the feedback node, wherein the first to third PMOS transistors are controlled by the preset signal, the enable signal, and the clock signal, respectively;
a first NMOS transistor connected between the feedback node and ground and controlled by the preset signal;
a second NMOS transistor connected between the feedback node and ground and controlled by the enable signal;
an inverter having an input terminal connected to the feedback node; and
third and fourth NMOS transistors connected in series between the feedback node and ground, wherein the third NMOS transistor is controlled by the clock signal and the fourth NMOS transistor is controlled by an output of the inverter.

19. A gated flip-flop circuit comprising:
a pulse generator with a feedback node for generating gated clock pulse signals in synchronization with a clock signal;
a latch for receiving and latching data in response to the gated clock pulse signals; and
a control circuit connected to the feedback node for controlling the feedback node in response to a reset signal, an enable signal, and the clock signal,
wherein the control circuit comprises:
  first to third PMOS transistors connected in series between a power supply voltage and the feedback node, wherein the first to third PMOS transistors are controlled by the reset signal, the enable signal, and the clock signal, respectively;
  a first NMOS transistor connected between the feedback node and ground and controlled by the reset signal;
  a second NMOS transistor connected between the feedback node and ground and controlled by the enable signal;
  an inverter having an input terminal connected to the feedback node; and
  third and fourth NMOS transistors connected in series between the feedback node and ground, wherein the third NMOS transistor is controlled by the clock signal and the fourth NMOS transistor is controlled by an output of the inverter.

20. A gated flip-flop circuit comprising:
a pulse generator with a feedback node for generating gated clock pulse signals in synchronization with a clock signal;
a latch for receiving and latching data in response to the gated clock pulse signals; and
a control circuit connected to the feedback node for controlling the feedback node in response to a scan enable signal, an enable signal, and the clock signal,
wherein the control circuit comprises:
  first and second PMOS transistors connected in series between a power supply voltage and the feedback node, wherein the first and second PMOS transistors are controlled by the enable signal and the clock signal, respectively;
  first and second NMOS transistors connected between the feedback node and ground, wherein the first and second NMOS transistors are controlled by the enable signal and the scan enable signal, respectively;
  an inverter having an input terminal connected to the feedback node; and
  third and fourth NMOS transistors connected in series between the feedback node and ground, wherein the third NMOS transistor is controlled by the clock signal and the fourth NMOS transistor is controlled by an output of the inverter.

21. A gated flip-flop, comprising:
a latch configured to generate a data output signal in response to a data input signal and a pair of true and complementary clock pulses;
a pulse generator configured to generate the true and complementary clock pulses in response to a periodic clock signal; and
a control circuit coupled to a feedback node in said pulse generator, said control circuit configured to selectively enable said pulse generator in response to an enable signal and further configured to drive the feedback node with a signal that causes said pulse generator to terminate the true and complementary clock pulses in-sync with a leading edge of one of the true and complementary clock pulses.

* * * * *